US012253387B2

(12) United States Patent
Gurovich et al.

(10) Patent No.: US 12,253,387 B2
(45) Date of Patent: Mar. 18, 2025

(54) SYSTEM AND METHOD FOR DETERMINING A CONFIGURATION OF A MEASUREMENT VOLUME

(71) Applicant: Elbit Systems Ltd., Haifa (IL)

(72) Inventors: Evgeni Gurovich, Haifa (IL); Yoav Ophir, Haifa (IL)

(73) Assignee: Elbit Systems Ltd., Haifa (IL)

( * ) Notice: Subject to any disclaimer, the term of this patent is extended or adjusted under 35 U.S.C. 154(b) by 15 days.

(21) Appl. No.: 17/942,498

(22) Filed: Sep. 12, 2022

(65) Prior Publication Data

US 2023/0003550 A1    Jan. 5, 2023

Related U.S. Application Data

(63) Continuation of application No. PCT/IL2021/050275, filed on Mar. 11, 2021.

(30) Foreign Application Priority Data

Mar. 12, 2020   (IL) ............................................ 273287

(51) Int. Cl.
*G01D 5/14*      (2006.01)
(52) U.S. Cl.
CPC ....................................... *G01D 5/14* (2013.01)
(58) Field of Classification Search
CPC ....................................................... G01D 5/14
See application file for complete search history.

(56) References Cited

U.S. PATENT DOCUMENTS

| 4,314,251 A | 2/1982 | Raab |
| 4,396,885 A | 8/1983 | Constant |

(Continued)

FOREIGN PATENT DOCUMENTS

| WO | WO-92/00529 A1 | 1/1992 |
| WO | WO-99/61861 A1 | 12/1999 |

(Continued)

OTHER PUBLICATIONS

International Search Report for PCT Application No. PCT/IL2021/050275, mailed Jul. 6, 2021.

(Continued)

*Primary Examiner* — Walter L Lindsay, Jr.
*Assistant Examiner* — Milton Gonzalez
(74) *Attorney, Agent, or Firm* — PEARL COHEN ZEDEK LATZER BARATZ LLP

(57) ABSTRACT

A method of determining a configuration of a measurement volume, the method may include: generating, by at least one transmitter, a transmitted magnetic field within the measurement volume; measuring, by at least one receiver positioned, a total magnetic field in the measurement volume at at least one receiver position and generating at least one receiver output signal; generating, by a processing unit, a measured dataset; comparing, by the processing unit, the measured dataset with at least one of at least two reference configuration datasets each for determined for one of at least two different configurations of the measurement volume; and identifying, by the processing unit, a reference configuration dataset of the at least two reference configuration datasets that corresponds to the measured dataset.

16 Claims, 12 Drawing Sheets

(56) References Cited

U.S. PATENT DOCUMENTS

| | | | |
|---|---|---|---|
| 5,694,041 | A | 12/1997 | Lescourret |
| 5,847,976 | A | 12/1998 | Lescourret |
| 6,057,756 | A * | 5/2000 | Engellenner .......... G08B 13/248 |
| | | | 705/28 |
| 6,073,043 | A | 6/2000 | Schneider |
| 7,019,647 | B2 * | 3/2006 | Flament ................ G01V 15/00 |
| | | | 340/552 |
| 7,532,997 | B2 | 5/2009 | Li |
| 8,072,220 | B2 | 12/2011 | Dolgin |
| 8,683,707 | B1 | 4/2014 | Horton |
| 8,855,671 | B1 * | 10/2014 | Mirov ................... G01C 21/206 |
| | | | 455/456.1 |
| 10,380,881 | B2 * | 8/2019 | Xu ........................... G01S 13/04 |
| 2005/0046608 | A1 | 3/2005 | Schantz |
| 2011/0062947 | A1 | 3/2011 | Favre-Reguillon |
| 2011/0156957 | A1 | 6/2011 | Waite |
| 2014/0222409 | A1 | 8/2014 | Efrat et al. |
| 2016/0161241 | A1 | 6/2016 | Li |

FOREIGN PATENT DOCUMENTS

| | | |
|---|---|---|
| WO | WO-00/36428 A1 | 6/2000 |
| WO | WO-01/33231 A2 | 5/2001 |
| WO | WO-01/079778 A1 | 10/2001 |
| WO | WO-02/07497 A2 | 1/2002 |
| WO | WO-2010/058390 A1 | 5/2010 |
| WO | WO-2012/091726 A1 | 7/2012 |
| WO | WO-2015/067903 A1 | 5/2015 |
| WO | WO-2015/155775 A1 | 10/2015 |
| WO | WO-2016/182559 A1 | 11/2016 |
| WO | WO 2019/154097 | 8/2019 |

OTHER PUBLICATIONS

Office action for Israel Patent Application No. 273287, mailed Dec. 31, 2020.

* cited by examiner

400

402 Generating, by at least one transmitter positioned at corresponding at least one transmitter position within a measurement volume, a transmitted magnetic field within the measurement volume

404 Measuring, by at least one receiver positioned at corresponding at least one receiver position within the measurement volume, a total magnetic field in the measurement volume at the at least one receiver position

406 Generating, by the at least one receiver and based on the measured magnetic field, at least one receiver output signal

408 Generating, by a processing unit and based on the at least one receiver output signal, a measured dataset comprising at least one measured dataset value that represents the total magnetic field measured by the at least one receiver at the at least one receiver position

410 Comparing, by the processing unit, the measured dataset with at least one of at least two reference configuration datasets, wherein each of the at least one of at least two reference configuration datasets comprises at least one reference configuration dataset value that represents the total magnetic field measured in at least one location in the measurement volume for one of at least two different configurations of the measurement volume

412 Identifying, by the processing unit, based on the comparison thereof, a reference configuration dataset of the at least two reference configuration datasets that corresponds to the measured dataset

*Fig. 4*

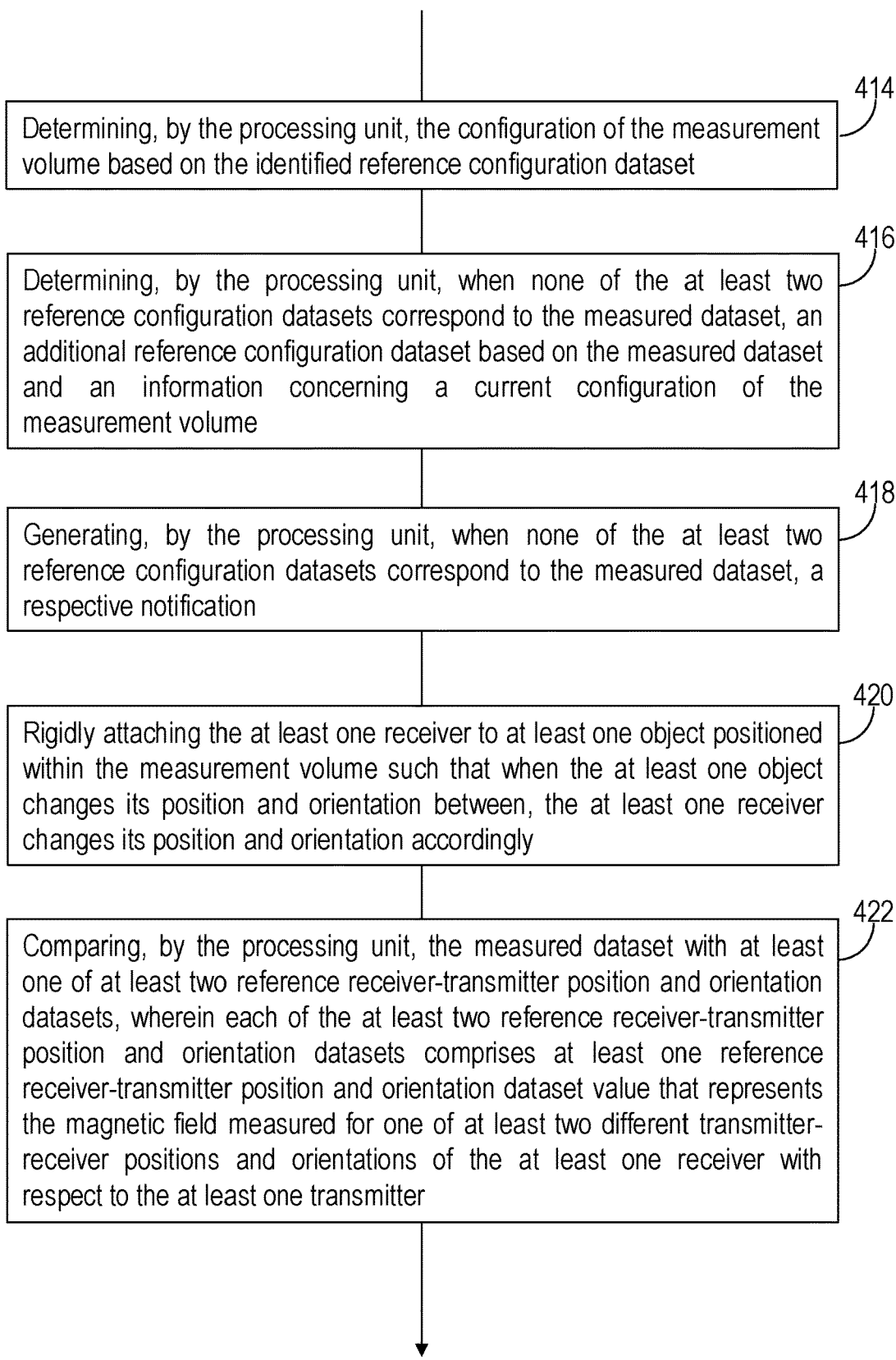
Fig. 4 (cont. 1)

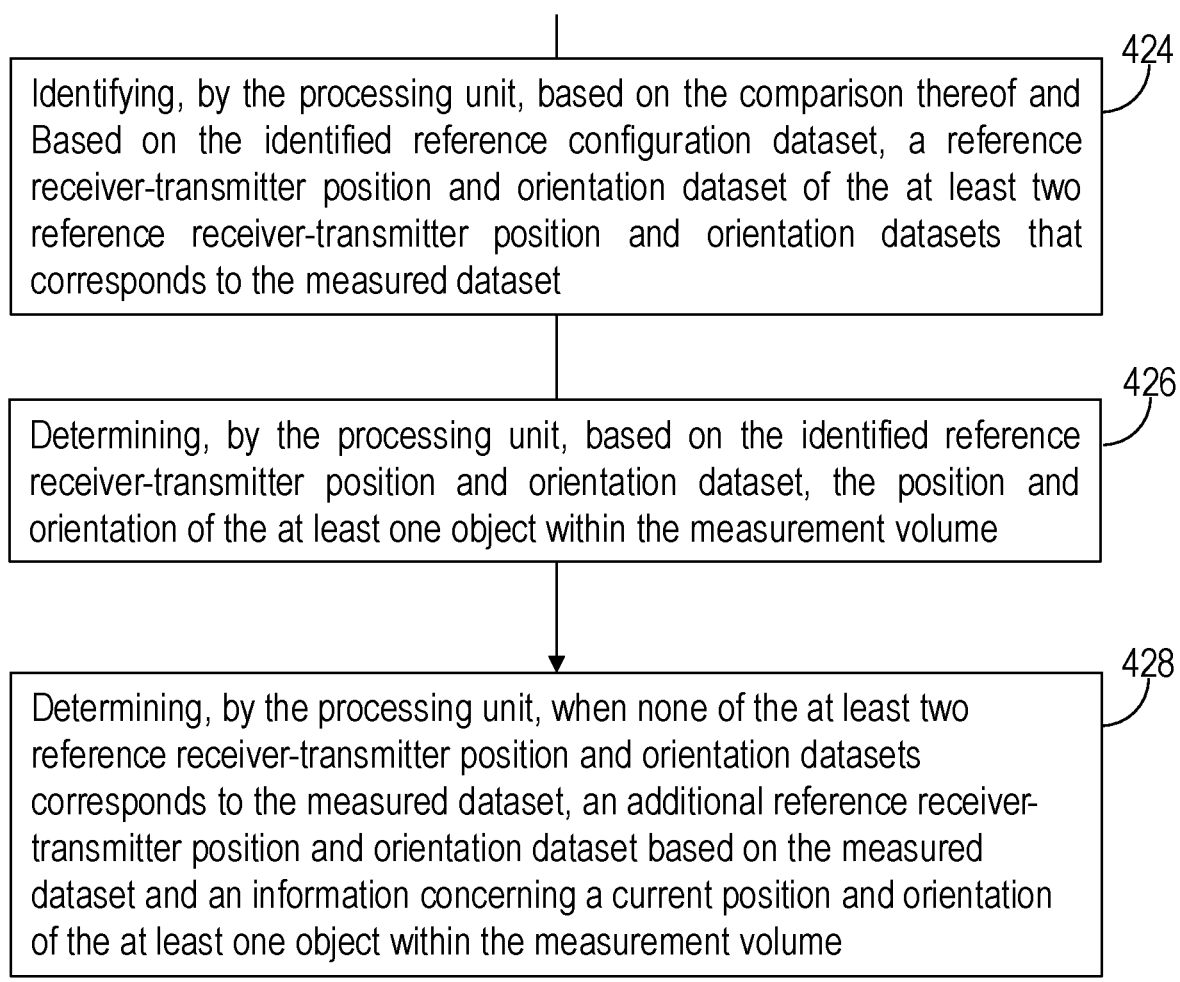
Fig. 4 (cont. 2)

500

502 Generating, by at least one transmitter rigidly attached to a first element, a magnetic field

504 Measuring, by at least one receiver rigidly attached to a second element, the magnetic field when the first element and second element are at a specified position and orientation with respect to each other and when the at least one receiver and the at least one transmitter are at a receiver-transmitter position and orientation with respect to each other

506 Generating, by the at least one receiver, at least one receiver output signal based on the measured magnetic field

508 Generating, by a processing unit, a measured dataset based on the at least one receiver output signal, wherein the measured dataset comprises at least one measured dataset value that represents the magnetic field measured by the at least one receiver at the receiver-transmitter position and orientation with respect to the at least one transmitter

510 Comparing, by the processing unit, the measured dataset with at least one of at least two reference receiver-transmitter position and orientation datasets, wherein each of the at least two reference receiver-transmitter position and orientation datasets comprises at least one reference receiver-transmitter position and orientation dataset value that represents the magnetic field measured for one of at least two different transmitter-receiver positions and orientations of the at least one receiver with respect to the at least one transmitter

512 Identifying, by the processing unit, based on the comparison thereof, a reference receiver-transmitter position and orientation dataset of the at least two reference receiver-transmitter position and orientation datasets that corresponds to the measured dataset

*Fig. 5*

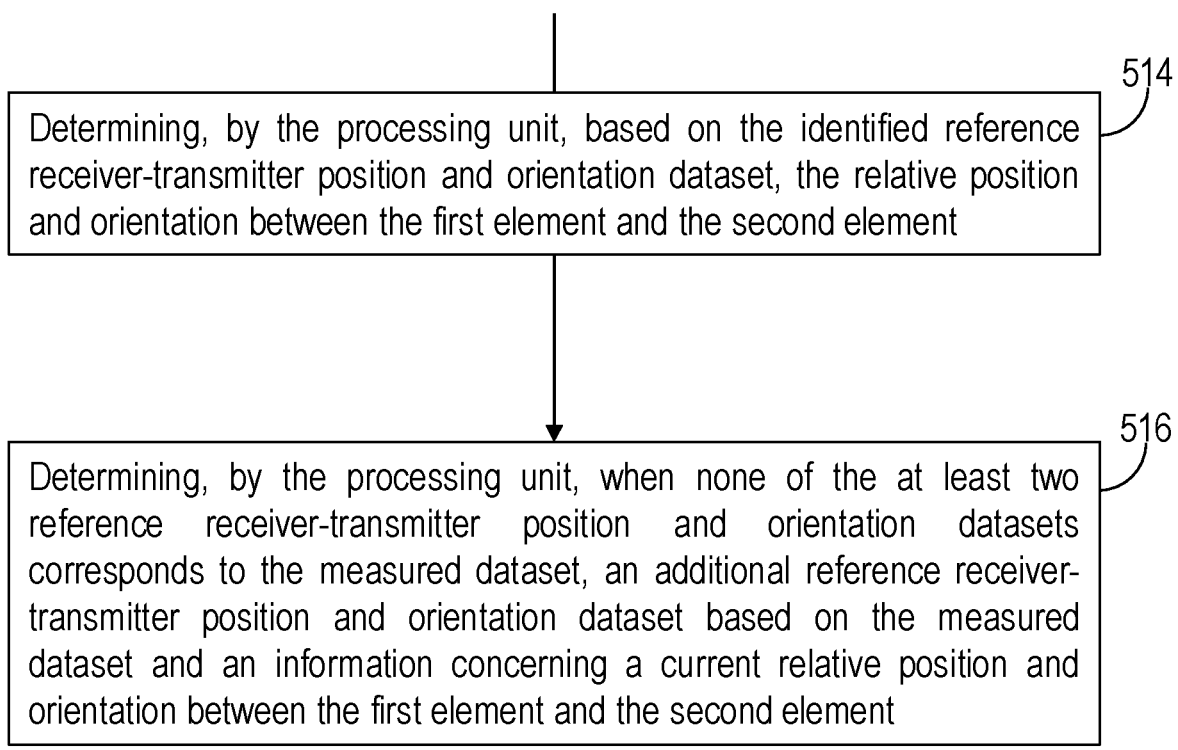
Fig. 5 (cont. 1)

US 12,253,387 B2

SYSTEM AND METHOD FOR DETERMINING A CONFIGURATION OF A MEASUREMENT VOLUME

CROSS REFERENCE TO RELATED APPLICATIONS

This application is a continuation of PCT Application No. PCT/IL2021/050275 filed on Mar. 11, 2021, claiming priority from Israeli Patent Application No. 273287 filed on Mar. 12, 2020, all of which are incorporated herein by reference in their entirety.

FIELD OF THE INVENTION

The present invention relates to the field of systems and methods for determining a configuration of a measurement volume, and more particularly, to systems and methods for determining a configuration of a measurement volume based on a magnetic field within the measurement volume.

BACKGROUND OF THE INVENTION

A configuration of a measurement volume, for example a spatial arrangement, a position and orientation and/or a state of at least one element of the measurement volume, may affect a magnetic field transmitted into the measurement volume. For example, the transmitted magnetic field may induce electric currents within the element(s) thereof that in turn may generate at least one induced magnetic field within the measurement volume.

Such effects on the transmitted magnetic field need to be accounted for when, for example, using magnetic trackers to track a position and orientation of objects within the measurement volume. In order to account for the effects of such element(s) on the transmitted magnetic field, location sensors are typically attached to the element(s) and/or users are requested to define the spatial arrangement, the position and orientation and/or the state of such elements. However, such approaches require additional processing and/or may be inaccurate. Some other procedures of determining a configuration of the measurement volume may utilize optical and/or intertidal sensors. However, optical sensors require constant line of sight to the elements of the measurement volume while inertial sensors may have significant drifting over time.

SUMMARY OF THE INVENTION

Some aspects of the present invention may provide a system for determining a configuration of a measurement volume, the system may include: at least one transmitter adapted to be positioned within the measurement volume at corresponding at least one transmitter position and adapted to generate a transmitted magnetic field within the measurement volume; at least one receiver adapted to be positioned within the measurement volume at corresponding at least one receiver position, the at least one receiver is adapted to measure a total magnetic field in the measurement volume at the at least one receiver position and generate at least one receiver output signal; a database that may include at least two reference configuration datasets each may include at least one reference configuration dataset value that represents a total magnetic field premeasured in at least one location in the measurement volume for one of at least two different configurations of the measurement volume; and a processing unit configured to: receive the at least one receiver output signal, generate a measured dataset based on the at least one receiver output signal, the measured dataset may include at least one measured dataset value that represents the total magnetic field measured by the at least one receiver at the at least one receiver position, compare the measured dataset with at least one of the at least two reference configuration datasets, and identify, based on the comparison thereof, a reference configuration dataset of the at least two reference configuration datasets that corresponds to the measured dataset.

In some embodiments, the processing unit may be further configured to determine the configuration of the measurement volume based on the identified reference configuration dataset.

In some embodiments, the processing unit may be configured, when none of the at least two reference configuration datasets correspond to the measured dataset, to at least one of determine an additional reference configuration dataset based on the measured dataset and an information concerning a current configuration of the measurement volume or generate a respective notification.

In some embodiments, wherein the measurement volume may include at least one object that can change its position and orientation between at least two different object positions and/or orientations, and the at least one receiver is rigidly attachable to the at least one object such that when the at least one object changes its position and orientation between, the at least one receiver changes its position and orientation accordingly.

In some embodiments, the database may include at least two reference receiver-transmitter position and orientation datasets, and each of the at least two reference receiver-transmitter position and orientation datasets may include at least one reference receiver-transmitter position and orientation dataset value that represents the total magnetic field measured for one of at least two different transmitter-receiver positions and orientations of the at least one receiver with respect to the at least one transmitter.

In some embodiments, the processing unit may be configured to: compare the measured dataset with at least one of the at least two reference receiver-transmitter position and orientation datasets; and identify, based on the comparison thereof and based on the identified reference configuration dataset, a reference receiver-transmitter position and orientation dataset of the at least two reference receiver-transmitter position and orientation datasets that corresponds to the measured dataset.

In some embodiments, the processing unit may be configured to determine, based on the identified reference receiver-transmitter position and orientation dataset, the position and orientation of the at least one object within the measurement volume.

In some embodiments, the processing unit may be configured, when none of the at least two reference receiver-transmitter position and orientation datasets corresponds to the measured dataset, to at least one of determine an additional reference receiver-transmitter position and orientation dataset based on the measured dataset and an information concerning a current position and orientation of the at least one object within the measurement volume or generate a respective notification.

Some aspects of the present invention may provide a method of determining a configuration of a measurement volume, the method may include: generating, by at least one transmitter positioned at corresponding at least one transmitter position within a measurement volume, a transmitted magnetic field within the measurement volume; measuring, by at least one receiver positioned at corresponding at least one receiver position within the measurement volume, a total magnetic field in the measurement volume at the at least one receiver position and generating at least one receiver output signal; generating, by a processing unit and based on the at least one receiver output signal, a measured dataset including at least one measured dataset value that represents the total magnetic field measured by the at least one receiver at the at least one receiver position; comparing, by the processing unit, the measured dataset with at least one of at least two reference configuration datasets, wherein each of the at least one of at least two reference configuration datasets may include at least one reference configuration dataset value that represents the total magnetic field measured in at least one location in the measurement volume for one of at least two different configurations of the measurement volume; and identifying, by the processing unit, based on the comparison thereof, a reference configuration dataset of the at least two reference configuration datasets that corresponds to the measured dataset.

Some embodiments may include determining, by the processing unit, the configuration of the measurement volume based on the identified reference configuration dataset.

Some embodiments may include, when none of the at least two reference configuration datasets correspond to the measured dataset, at least one of determining, by the processing unit, an additional reference configuration dataset based on the measured dataset and an information concerning a current configuration of the measurement volume or generating a respective notification.

Some embodiments may include rigidly attaching the at least one receiver to at least one object positioned within the measurement volume such that when the at least one object changes its position and orientation between, the at least one receiver changes its position and orientation accordingly.

Some embodiments may include comparing, by the processing unit, the measured dataset with at least one of at least two reference receiver-transmitter position and orientation datasets, wherein each of the at least two reference receiver-transmitter position and orientation datasets may include at least one reference receiver-transmitter position and orientation dataset value that represents the magnetic field measured for one of at least two different transmitter-receiver positions and orientations of the at least one receiver with respect to the at least one transmitter.

Some embodiments may include identifying, by the processing unit, based on the comparison thereof and based on the identified reference configuration dataset, a reference receiver-transmitter position and orientation dataset of the at least two reference receiver-transmitter position and orientation datasets that corresponds to the measured dataset.

Some embodiments may include determining, by the processing unit, based on the identified reference receiver-transmitter position and orientation dataset, the position and orientation of the at least one object within the measurement volume.

Some embodiments may include, when none of the at least two reference receiver-transmitter position and orientation datasets corresponds to the measured dataset, at least one of determining, by the processing unit, an additional reference receiver-transmitter position and orientation dataset based on the measured dataset and an information concerning a current position and orientation of the at least one object within the measurement volume or generating a respective notification.

Some aspects of the present invention may include a system for determining a relative position between two or more elements, the system may include: at least one transmitter adapted to be rigidly attachable to a first element and to generate a magnetic field; at least one receiver adapted to be rigidly attachable to a second element and to measure the magnetic field when the first element and second element are at a specified position and orientation with respect to each other and when the at least one receiver and the at least one transmitter are a receiver-transmitter position and orientation with respect to each other, and to generate at least one receiver output signal; a database including at least two reference receiver-transmitter position and orientation datasets, each including at least one reference receiver-transmitter position and orientation dataset value that represents the magnetic field measured for one of at least two different transmitter-receiver positions and orientations of the at least one receiver with respect to the at least one transmitter; and a proceeding unit configured to: receive the at last one receiver output signal from the at least one receiver, generate a measured dataset based on the at least one receiver output signal, wherein the measured dataset may include at least one measured dataset value that represents the magnetic field measured by the at least one receiver at the receiver-transmitter position and orientation with respect to the at least one transmitter, compare the measured dataset with at least one of the at least two reference receiver-transmitter position and orientation datasets, and identify, based on the comparison thereof, a reference receiver-transmitter position and orientation dataset of the at least two reference receiver-transmitter position and orientation datasets that corresponds to the measured dataset.

In some embodiments, the processing unit may be configured to determine, based on the identified reference receiver-transmitter position and orientation dataset, the relative position and orientation between the first element and the second element.

In some embodiments, the processing units may be configured, when none of the at least two reference receiver-transmitter position and orientation datasets corresponds to the measured dataset, to at least one of determine an additional reference receiver-transmitter position and orientation dataset based on the measured dataset and an information concerning a current relative position and orientation between the first element and the second element or to generate a respective notification.

Some aspects of the present invention may include a method of determining a relative position between two or more elements, the method may include: generating, by at least one transmitter rigidly attached to a first element, a magnetic field; measuring, by at least one receiver rigidly attached to a second element, the magnetic field when the first element and second element are at a specified position and orientation with respect to each other and when the at least one receiver and the at least one transmitter are at a receiver-transmitter position and orientation with respect to each other and generating at least one receiver output signal; generating, by a processing unit, a measured dataset based on the at least one receiver output signal, wherein the measured dataset may include at least one measured dataset value that represents the magnetic field measured by the at least one receiver at the receiver-transmitter position and orientation with respect to the at least one transmitter; comparing, by the processing unit, the measured dataset with at least one of at least two reference receiver-transmitter position and orientation datasets, wherein each of the at least two reference receiver-transmitter position and orientation datasets may include at least one reference receiver-transmitter position and orientation dataset value that represents the magnetic field measured for one of at least two different transmitter-receiver positions and orientations of the at least one receiver with respect to the at least one transmitter; and identifying, by the processing unit, based on the comparison thereof, a reference receiver-transmitter position and orientation dataset of the at least two reference receiver-transmitter position and orientation datasets that corresponds to the measured dataset.

Some embodiments may include determining, by the processing unit, based on the identified reference receiver-transmitter position and orientation dataset, the relative position and orientation between the first element and the second element.

Some embodiments may include, when none of the at least two reference receiver-transmitter position and orientation datasets corresponds to the measured dataset, at least one of determining, by the processing unit, an additional reference receiver-transmitter position and orientation dataset based on the measured dataset and an information concerning a current relative position and orientation between the first element and the second element or generating a respective notification.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same can be carried into effect, reference will now be made, purely by way of example, to the accompanying drawings in which like numerals designate corresponding elements or sections throughout.

In the accompanying drawings:

FIG. 4 is a flowchart of a method of determining a configuration of a measurement volume and of a position and orientation of an object within the measurement volume, according to some embodiments of the invention; and FIG. 5 is a flowchart of a method of determining a relative position between two or more elements, according to some embodiments of the invention.

Figure 1A:
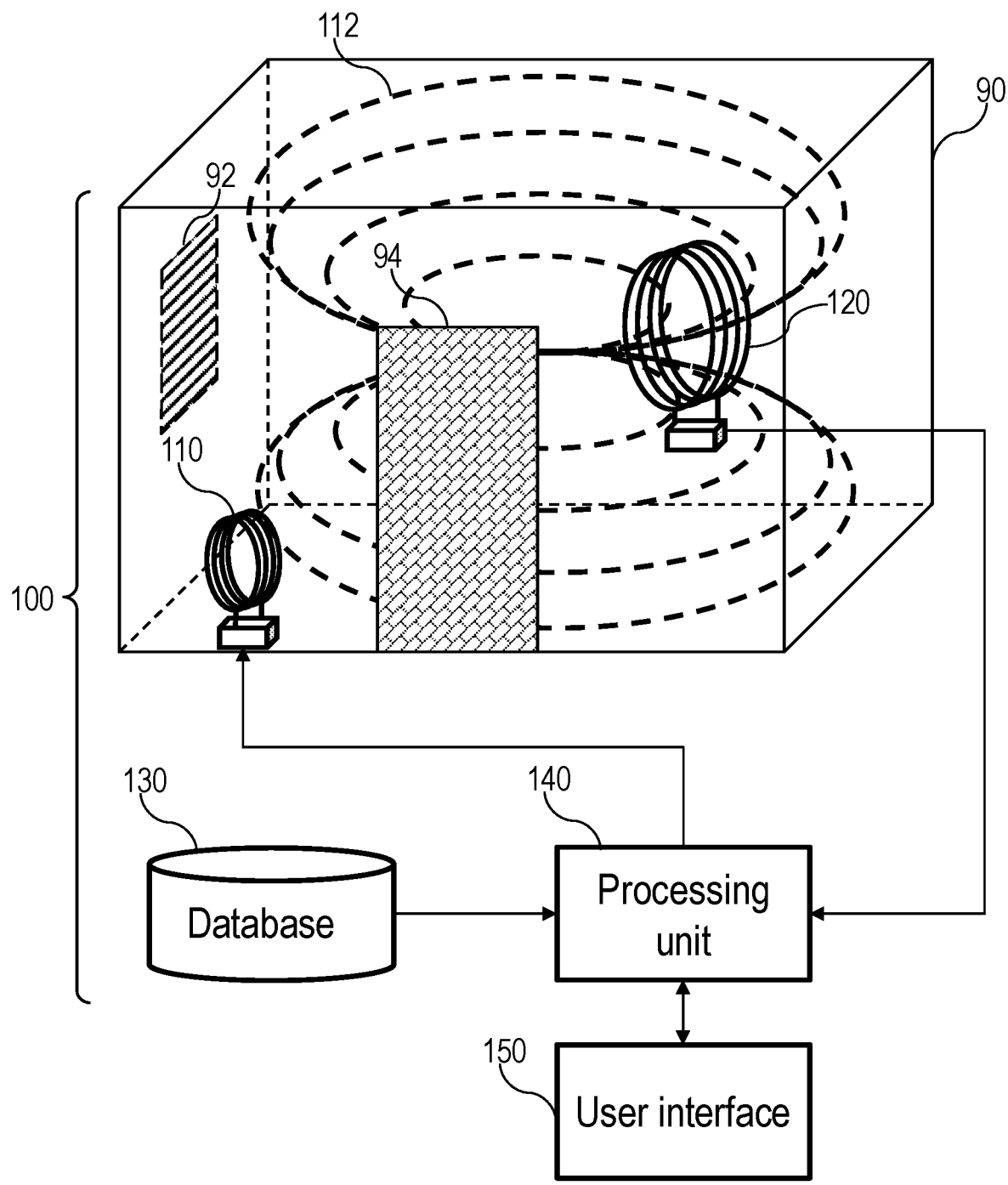
FIG. 1A is a schematic illustration of a system for determining a configuration of a measurement volume, according to some embodiments of the invention.

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention can be practiced without the specific details presented herein. Furthermore, well known features can have been omitted or simplified in order not to obscure the present invention. With specific reference to the drawings, it is stressed that the particulars shown are by way of example and for purposes of illustrative discussion of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention can be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that can be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. Any of the disclosed modules or units can be at least partially implemented by a computer processor.

Reference is now made to FIG. 1A, which is a schematic illustration of a system 100 for determining a configuration of a measurement volume 90, according to some embodiments of the invention.

Reference is also made to FIGS. 1B, 1C, 1D and 1E, which are schematic illustrations of various configurations of a measurement volume 90 that may affect a magnetic field in measurement volume 90, according to some embodiments of the invention.

Figure 1B:
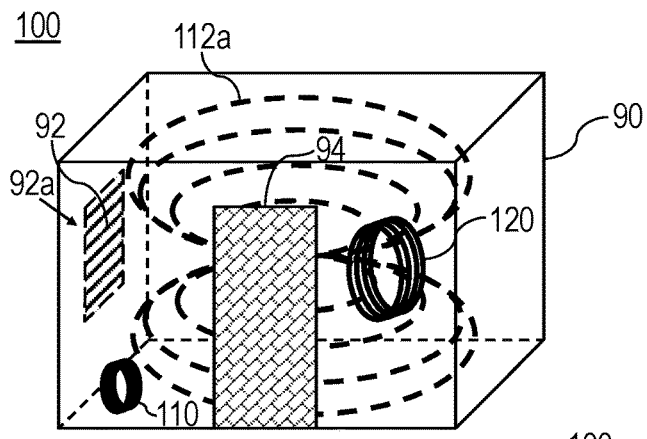
FIGS. 1B, 1C, 1D and 1E are schematic illustrations of various configurations of a measurement volume that may affect a magnetic field in measurement volume, according to some embodiments of the invention.
Figure 1C:
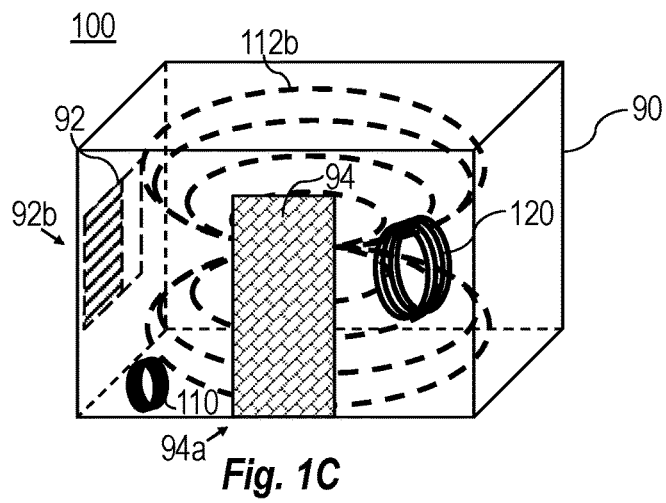
Figure 1D:
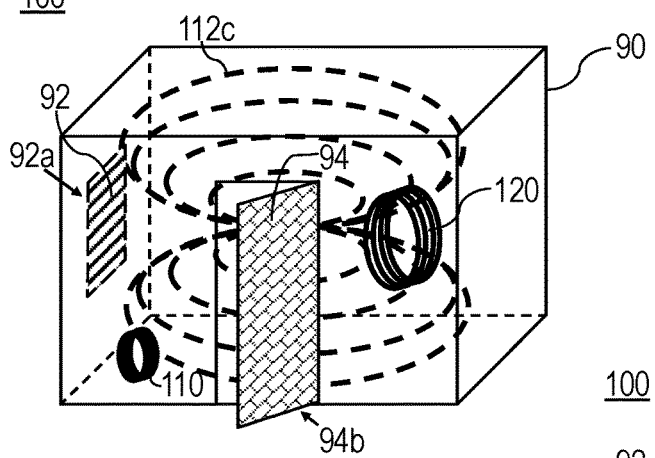
Figure 1E:
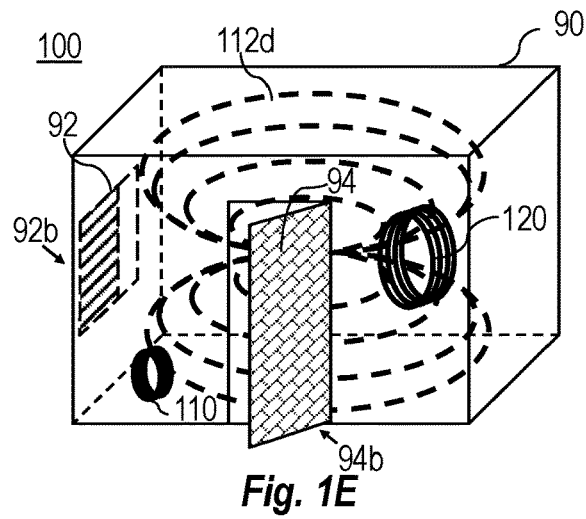
Figure 1F:
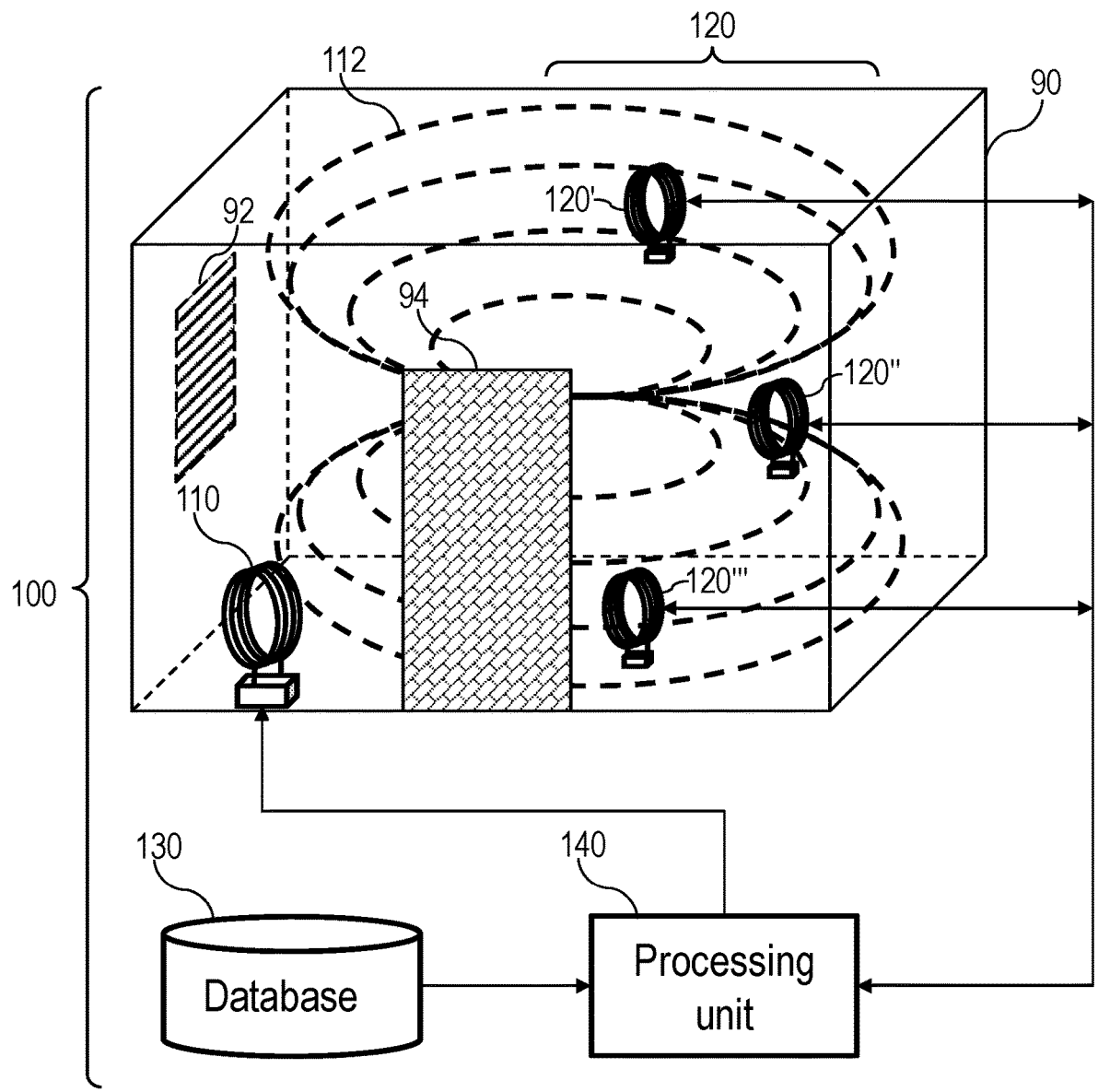
FIG. 1F and FIG. 1G are schematic illustrations of a system for determining a configuration of a measurement volume and including multiple receivers, according to some embodiments of the invention.

Reference is also made to FIG. 1F, which is a schematic illustration of a system 100 for determining a configuration of a measurement volume 90 and including multiple receivers 120, according to some embodiments of the invention.

Figure 1G:
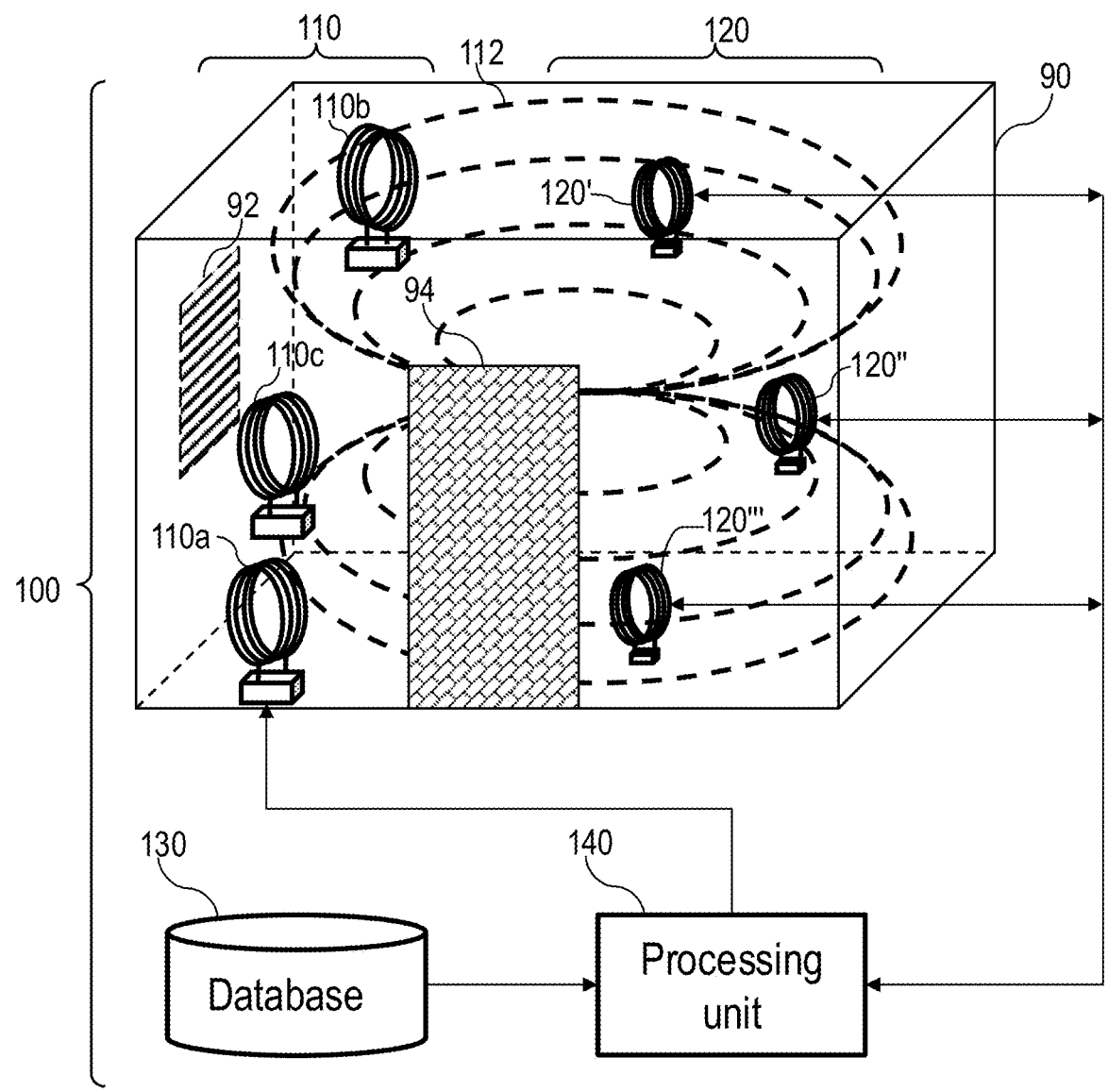
Figure 1H:
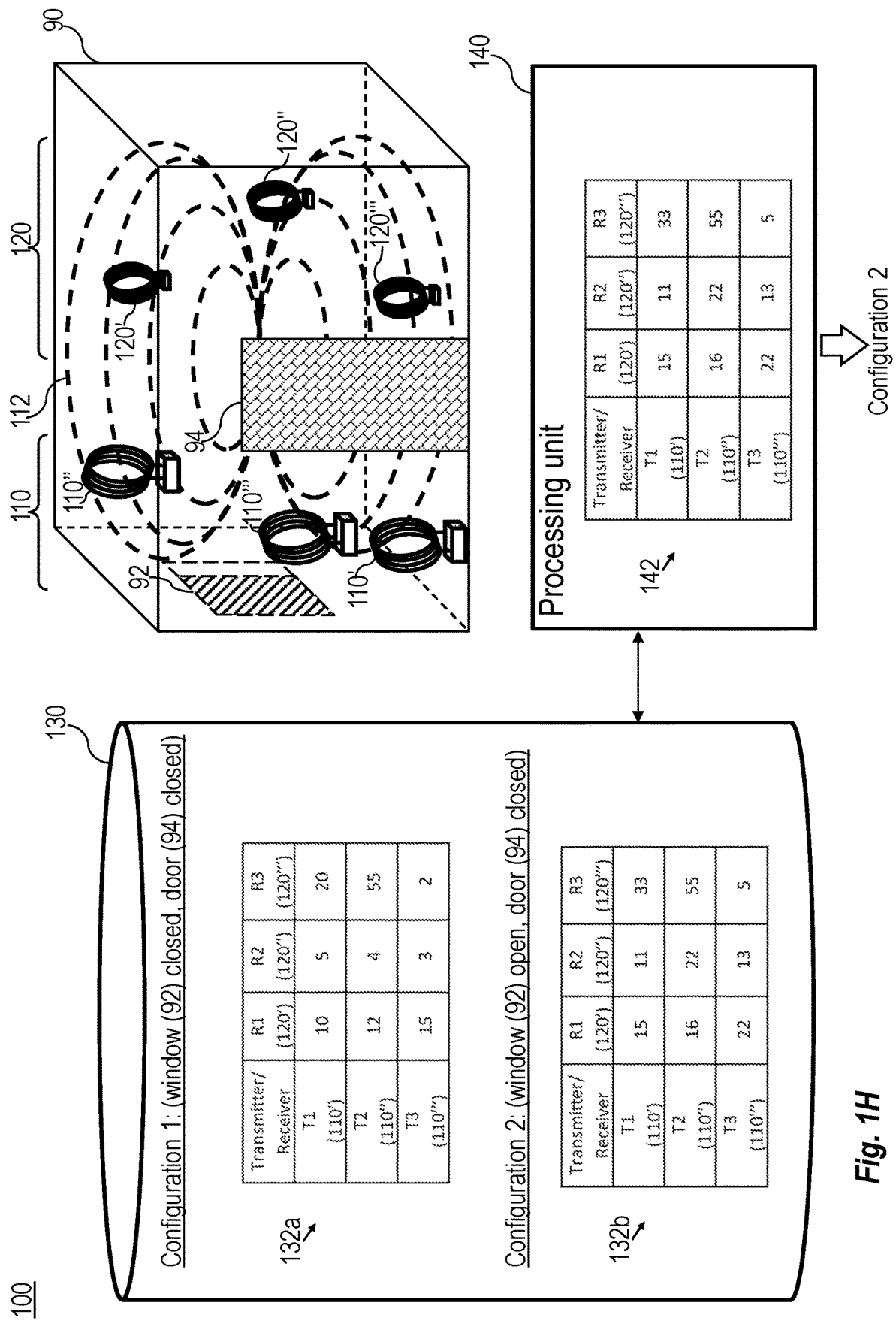
FIG. 1H depicts an example of determining a configuration of a measurement 90 by a system for determining a configuration of a measurement volume, according to some embodiments of the invention.

Reference is also made to FIG. 1H, which depicts an example of determining a configuration of measurement volume 90 by a system 100 for determining a configuration of a measurement volume 90, according to some embodiments of the invention.

According to some embodiments, system 100 may include at least one transmitter 110, at least one receiver 120, a database 130, a processing unit 140 and a user interface 150 (e.g., as shown in FIG. 1A).

According to some embodiments, a transmitter 110 may be adapted to be positioned within measurement volume 90 and adapted to generate a transmitted magnetic field within measurement volume 90. For example, transmitter 110 may be unmovably positioned within measurement volume 90 at a transmitter position.

In some embodiments, measurement volume 90 may have at least two configurations that may affect the transmitted magnetic field in measurement volume 90. The configuration of measurement volume 90 may be dictated by, for example, a spatial arrangement, a position and orientation and/or a state of at least one element of measurement volume 90. Such at least one element may be made of conductive materials. For example, the transmitted magnetic field may induce electric currents within the at least one element thereof that in turn may generate at least one induced magnetic field within measurement volume 90. As a result, a total magnetic field 112 may be generated within measurement volume 90, wherein total magnetic field 112 may include the transmitted magnetic field and/or the at least one induced magnetic field. Total magnetic field 112 may thus depend on the configuration of measurement volume 90 (e.g., depend on the spatial arrangement, the position and orientation and/or the state of the at least one element within measurement volume 90).

For example, as schematically illustrated in FIGS. 1B, 1C, 1D and 1E, measurement volume 90 may have a first element 92 (e.g., a window) and a second element 94 (e.g., a door). First element 92 may be switchable between its initial state 92a (e.g., when the widow is closed) and at least one another state 92b (e.g., when the window is open), for example as shown in FIGS. 1B and 1C, respectively. Second element 94a may be switchable between its initial state 94a (e.g., when the door is closed) and at least one another state 94b (e.g., when the door is open), for example as shown in FIGS. 1B and 1D, respectively.

For example, when first element 92 and second element 94 are in their initial states 92a, 94a, respectively, a first total magnetic field 112a may be generated within measurement volume (e.g., as shown in FIG. 1B). In another example, when first element 92 is in its at least one another state 92b, a second total magnetic field 112b may be generated within measurement volume 90 (e.g., as shown in FIG. 1C). In another example, when second element 94 is in its at least one another state 94b, a third total magnetic field 112c may be generated within measurement volume 90 (e.g., as shown in FIG. 1D). In another example, when first element 92 and second element 94 are in their at least one another states 92b, 94b, respectively, a fourth total magnetic field 112d may be generated in measurement volume 90 (e.g., as shown in FIG. 1E).

In some embodiments, receiver 120 may be adapted to be positioned within measurement volume 90. For example, receiver 120 may be unmovably positioned within measurement volume 90 at a receiver position. In various embodiments, positions and orientations of receiver 120 and transmitter 110 in measurement volume 90 may be known or predetermined. In some embodiments, positions and orientations of receiver 120 and transmitter 110 in measurement volume 90 may be kept unchanged (or substantially unchanged) during the operation of system 100.

Receiver 120 may measure total magnetic field 112 at the receiver position in measurement volume 90 and generate a receiver output signal based on the measured magnetic field.

In some embodiments, processing unit 140 may receive the receiver output signal from receiver 120. Processing unit 140 may generate a measured dataset based on the receiver output signal. The measured dataset may, for example, include a measured dataset value that may represent the magnetic field measured at the receiver position in measurement volume 90.

In some embodiments, system 100 may include multiple receivers 120 adapted to be positioned at corresponding multiple receiver positions within measurement volume 90 (e.g., as shown in FIG. 1F). For example, in embodiments shown in FIG. 1F, system 100 may include three receivers 120 (e.g., a first receiver 120', a second receiver 120" and a third receiver 120'''). Multiple receivers 120 may measure total magnetic field 112 at the corresponding multiple receiver positions and generate corresponding multiple receiver output signals. In embodiments shown in FIG. 1F, the measured dataset generated by processing unit 140 based on the multiple receiver output signals from the multiple receivers 120 may include multiple measured dataset values that may represent the total magnetic field measured in the corresponding multiple receiver positions in measurement volume 90. In some embodiments, the multiple receiver positions may be predetermined to cover the entire (or substantially entire) measurement volume 90.

In some embodiments, system 100 may include multiple transmitters 110. For example, in embodiments shown in FIG. 1G, system 100 may include three transmitters 110 (e.g., a first transmitter 110a, a second transmitter 110b and a third transmitter 110c). In some embodiments, each of transmitters 110 may be configured to operate at a different frequency as compared to other transmitters of transmitters 110. For example, each of transmitters 110 may transmit a magnetic field having a different frequency as compared to frequencies of magnetic fields transmitted by other transmitters of transmitters 110. In some other embodiments, each of transmitters 110 may be controlled (e.g., by processing unit 140) to operate during a different time interval as compared to other transmitters of transmitters 110. In this manner, at least some of transmitters 110 may be associated with at least some of receivers 120 and/or interference between different transmitters 110 may be eliminated. Yet in this manner, a probability of readings randomity may be significantly reduced. For example, increasing the number of transmitters 110 and/or receivers 120 may reduce the probability that two different configurations will lead to the same measured dataset generated based on readings of receivers 120.

According to some embodiments, database 130 may include at least two reference configuration datasets. Each of the at least two reference configuration datasets may include at least one reference configuration dataset value that may represent total magnetic field 112 premeasured in at least one location of measurement volume 90 for one of the at least two configurations of measurement volume 90.

In some embodiments, each of the at least two reference configuration datasets may include multiple reference configuration dataset values that may represent the total magnetic field premeasured in corresponding multiple locations in measurement volume 90 for one of the at least two configurations of measurement volume 90. In some embodiments, the multiple locations may cover the entire (or substantially entire) measurement volume 90.

According to some embodiments, processing unit 140 may compare the measured dataset with at least one of the reference configuration datasets. Processing unit 140 may identify, based on the comparison thereof, a reference configuration dataset of the at least two reference configuration datasets that corresponds to the measured dataset.

In some embodiments, processing unit 140 may determine, based on the identified reference configuration dataset, the configuration of measurement volume 90. For example, if third magnetic field 112c is measured by receiver 120 in measurement volume 90, then processing unit 140 may determine that first element 92 is in its initial state 92a and that second element 94 is in its at least one another state 94b (e.g., as shown in FIG. 1D). In another example, if fourth magnetic field 112d is measured by receiver 120, then processing unit 140 may determine that first element 92 is in its at least one another state 92b and that second element 94 is in its at least one another state 94b (e.g., as shown in FIG. 1E).

FIG. 1H depicts another example of determining a configuration of measurement volume 90 by system 100. In example of FIG. 1H, database 130 includes two reference configuration datasets, e.g., a first reference configuration dataset 132a corresponding to a first configuration of measurement volume 90 in which a window (first element 92) is closed and a door (second element 94) is closed, and a second reference configuration dataset 132b corresponding to a second configuration of measurement volume 90 in which a window (first element 92) is opened and a door (second element 94) is closed. Yet in this example, each of first reference configuration dataset 132a and second reference configuration dataset 132b may include reference configuration datasets values that may represent total magnetic field 112 premeasured in measurement volume 90 by receivers 120 for the respective configuration thereof (e.g., as described above with respect to FIGS. 1A-1G).

In example of FIG. 1H, transmitters 110 may transmit transmitted magnetic fields into measurement volume 90, receivers 120 may measure total magnetic field 112 generated in measurement volume 90 and generate corresponding receivers signal outputs, and processing unit 140 may determine a measured configuration dataset 142 based on the receivers signal outputs (e.g., as described above). Measured configuration dataset 142 may include measured dataset values that may represent total magnetic field 112 measured in measurement volume 90 by receivers 120.

For example, at least some of reference configuration dataset values of the reference configuration datasets 132a, 132b, and/or at least some of the measured dataset values of the measured dataset 142 may be associated with specific receivers of receivers 120 and specific transmitters of transmitters 110 (e.g., as shown in FIG. 1H and as described above with respect to FIG. 1G).

Yet in example of FIG. 1H, processing unit 140 may compare measured configuration dataset 142 with first reference configuration dataset 132a and second reference configuration dataset 132b and determine based on the comparison thereof the configuration of measurement volume 90. In example of FIG. 1H, measured configuration dataset 142 corresponds to second reference configuration dataset 132b, meaning that measurement volume 90 is in the second configuration thereof.

According to some embodiments, for example when none of the at least two reference configuration datasets correspond to the measured dataset, processing unit 140 may determine an additional reference configuration dataset based on the measured dataset and an information concerning a current configuration of measurement volume 90.

For example, processing unit 140 may request and receive from a user of system 100 (e.g., via user interface 150) the information concerning the current configuration of measurement volume 90. In another example, processing unit 140 may receive the information concerning the current configuration of measurement volume 90 from another system for determining the configuration of measurement volume. For example, optical system (or any other system) may be also installed in measurement volume 90. In this case, if none of the at least two reference configuration datasets correspond to the measured dataset, the optical system may identify the current configuration of measurement volume 90 and supply this information to processing unit 140. Processing unit 140 may further save in database 130 the measured dataset as the additional reference configuration dataset for the current configuration.

In some embodiments, when none of the at least two reference configuration datasets correspond to the measured dataset, processing unit 140 may generate a respective notification. Such notification may be indicative of, for example, a failure in measurement volume 90 or in one of the elements thereof.

According to some embodiments, the at least two reference configuration datasets may be predetermined.

For example, prior to using of system 100, transmitter 110 may be positioned within measurement volume 90 at a known transmitter location and controlled by processing unit 140 to generate a transmitted magnetic field within measurement volume 90. The configuration of measurement volume 90 may be then changed according to at least two known/predetermined configurations thereof.

Receiver 120 may be positioned at known receiver location within measurement volume 90 and measure the total magnetic field at the known receiver location for each of the at least two known/predetermined configurations thereof and generate corresponding at least two receiver output signals. The positions and orientations of transmitter(s) 110 or receiver(s) 120 may be kept unchanged (or substantially unchanged) during predetermining of the reference configurations datasets and/or during subsequent ongoing operation of system 100.

Processing unit 140 may receive the at least two receiver output signals from receiver 120 and generate the corresponding at least two reference configuration datasets, each based on one of the at least two receiver output signals. In some embodiments, receiver 120 may be subsequently positioned at predetermined multiple receiver locations within measurement volume 90. In some other embodiments, multiple receivers 120 may be positioned at corresponding multiple known receiver locations within measurement volume 90. In some embodiments, the multiple locations may cover the entire (or substantially entire) measurement volume 90.

Accordingly, each of the at least two reference configuration datasets may include at least one reference configuration dataset value (or, in some embodiments, multiple reference configuration dataset values) that may represent the total magnetic field measured at the at least one known receiver location (or, in some embodiments, at the multiple know receiver locations) in measurement volume 90 for one of the at least two known/predetermined configurations of measurement volume 90.

Figure 2:
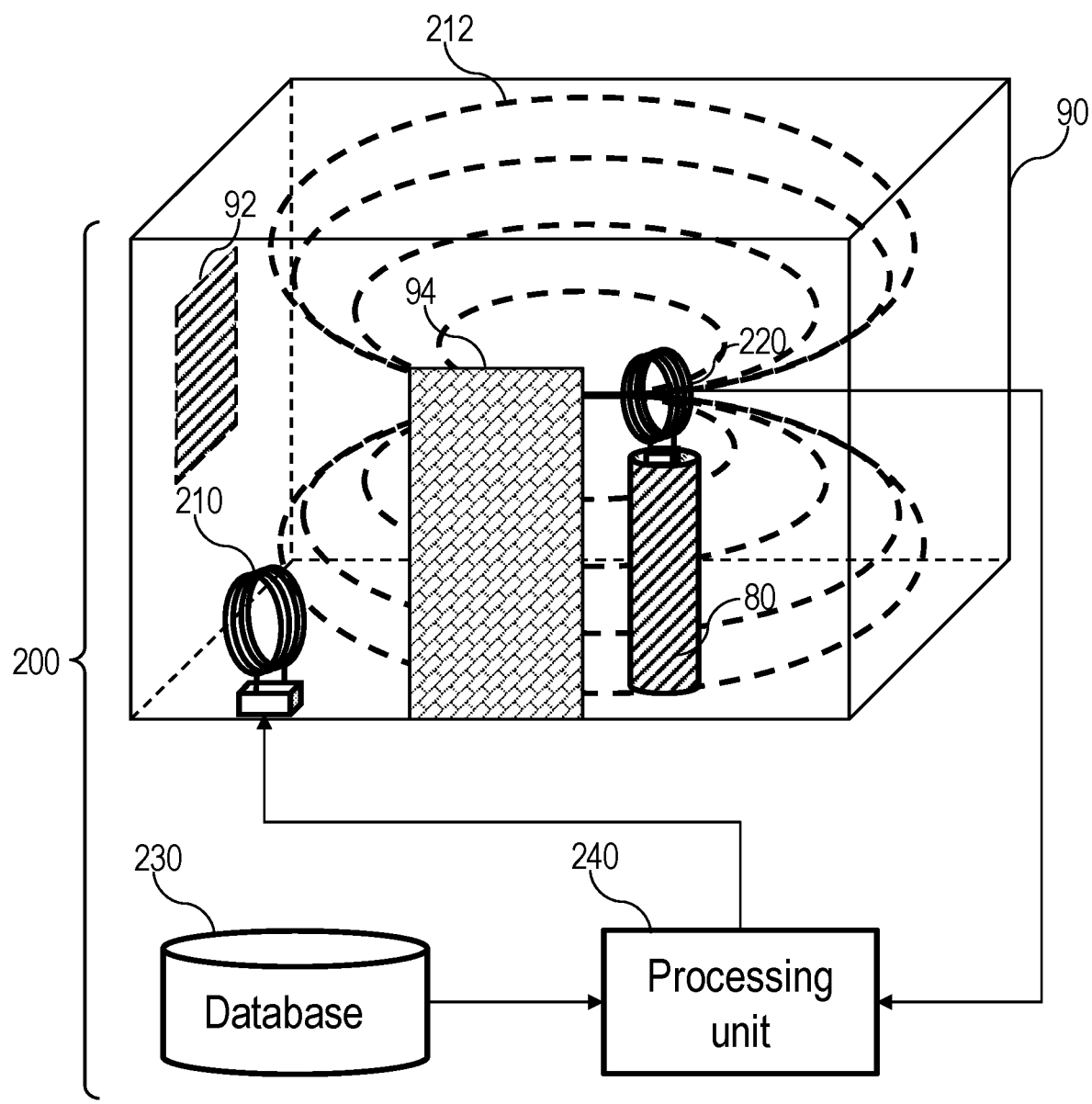
FIG. 2 is schematic illustrations of a system for determining a configuration of a measurement volume and capable of determining a position and orientation of at least one object within measurement volume, according to some embodiments of the invention.

Reference is now made to FIG. 2, which is schematic illustrations of a system 200 for determining a configuration of a measurement volume 90 and capable of determining a position and orientation of at least one object 80 within measurement volume 90, according to some embodiments of the invention.

According to some embodiments, system 200 may include at least one transmitter 210, at least one receiver 220, a database 230 and a processing unit 240 (e.g., as shown in FIG. 2A). For example, system 200, at least one transmitter 210, at least one receiver 220, database 230 and processing unit 240 may be similar to system 100, at least one transmitter 110, at least one receiver 120, database 130 and processing unit 140, respectively, as described above with respect to FIGS. 1A, 1B, 1C, 1D, 1E and 1F.

According to some embodiments, transmitter 210 may be adapted to be positioned within measurement volume 90 and adapted to generate a transmitted magnetic field within measurement volume 90. For example, transmitter 210 may be unmovably positioned within measurement volume 90 at a transmitter position.

The transmitted magnetic field may, in some embodiments, generate at least one induced magnetic field to yield a total magnetic field 212 within measurement volume 90. For example, total magnetic field 212 may be similar to total magnetic field 112 as described above with respect to FIGS. 1A, 1B, 1C, 1D, 1E, 1F, 1G and 1H. Measurement volume 90 may, in some embodiments, have at least two different configurations that may provide corresponding at least two different total magnetic fields 212 within measurement volume 90 (as described above with respect to FIGS. 1A, 1B, 1C, 1D, 1E and 1F).

According to some embodiments, database 230 may include at least two reference configuration datasets each for one of the at least two configurations of measurement volume 90. For example, the at least two reference configuration datasets may be similar to the at least two reference configuration datasets described above with respect to FIGS. 1A, 1B, 1C, 1D, 1E, 1F, 1G and 1H.

According to some embodiments, measurement volume 90 may include an object 80. In some embodiments, receiver 220 may be rigidly attachable to object 80 such that when object 80 changes its position and orientation, a receiver position and orientation of receiver 220 changes accordingly.

Object 80 may change its position and orientation within measurement volume 90 between at least two different positions and orientations. As a result, a relative position and orientation between transmitter 210 (e.g., unmovably positioned within measurement volume 90 at the transmitter position) and receiver 220 (e.g., rigidly attached to object 80) may change between at least two different transmitter-receiver positions and orientations.

Receiver 220 may measure total magnetic field 212 at a transmitter-receiver position and orientation and generate a receiver output signal. The receiver output signal generated by receiver 220 may, in some embodiments, be sensitive to the relative transmitter-receiver position and orientation between receiver 220 and transmitter 210. In this manner, the position and orientation of object 80 in measurement volume 90 may be determined based on the relative transmitter-receiver position and orientation between receiver 220 and transmitter 210.

According to some embodiments, processing unit 240 may receive the receiver output signal from receiver 220. Processing unit 240 may generate a measured dataset based on the receiver output signal. The measured dataset may include a measured dataset value that may represent the total magnetic field measured in measurement volume 90 by receiver 220 at the transmitter-receiver position and orientation.

In some embodiments, two or more receivers 220 may be used (e.g., as described above with respect to FIGS. 1F, 1G and 1H). For example, at least some of two or more receivers 220 may be attachable to object 80 while other receivers of two or more receivers 220 may be disposed at known locations within measurement volume 90 e.g., as described above with respect to FIGS. 1F, 1G and 1H. In these embodiments, the measured dataset may include two or more measured dataset values that may represent the total magnetic field measured in measurement volume 90 by two or more receivers 220 at the corresponding two or transmitter-receiver positions and orientations. In some embodiments, two or more transmitters 210 may be used (e.g., e.g., as described above with respect to FIGS. 1F, 1G and 1H).

According to some embodiments, database 230 may include at least two reference receiver-transmitter position and orientation datasets. Each of the at least two reference receiver-transmitter position and orientation datasets may include at least one reference receiver-transmitter position and orientation dataset value that may represent the magnetic field measured for one of the at least two different transmitter-receiver positions and orientations of receiver 220 with respect to transmitter 210.

According to some embodiments, processing unit 240 may compare the measured dataset with at least one reference configuration dataset of the at least two reference configuration datasets and identify, based on the comparison thereof, a reference configuration dataset of the at least two reference configuration datasets that corresponds to the measured dataset (e.g., as described above with respect to FIGS. 1A, 1B, 1C, 1D, 1E, 1F, 1G and 1H). The identified reference configuration dataset may be indicative of the configuration of measurement volume 90 (e.g., the spatial arrangement, the position and orientation and/or the state of the at least one element within measurement volume 90), for example as described above with respect to FIGS. 1A, 1B, 1C, 1D, 1F, 1G and 1H.

According to some embodiments, processing unit 240 may compare the measured dataset with at least one of the at least two reference receiver-transmitter position and orientation datasets.

Processing unit 240 may identify, based on the comparison thereof and based on the identified reference configuration dataset, a reference receiver-transmitter position and orientation dataset of the at least two reference receiver-transmitter position and orientation datasets that corresponds to the measured dataset.

In some embodiments, processing unit 240 may determine, based on the identified reference receiver-transmitter position and orientation dataset, the position and orientation of object 80 within measurement volume 90 (e.g., in a similar manner as described above with respect to FIG. 1H).

In some embodiments, for example when none of the at least two reference receiver-transmitter position and orientation datasets corresponds to the measured dataset, processing unit 240 may determine an additional reference receiver-transmitter position and orientation dataset based on the measured dataset and an information (e.g., user's input, another tracking system, etc.) concerning a current position and orientation of object 80 within measurement volume 90 (e.g., as described above with respect to FIGS. 1A, 1B, 1C, 1D, 1E, 1F, 1G and 1H). In some other embodiments, when none of the at least two reference receiver-transmitter position and orientation datasets corresponds to the measured dataset, processing unit 340 may generate a respective notification.

According to some embodiments, the at least two reference receiver-transmitter position and orientation datasets may be predetermined (e.g., similar to predetermination of the at least two reference configuration datasets as described above with respect to FIGS. 1A, 1B, 1C, 1D, 1E, 1F, 1G and 1H).

It is noted that system 200 may be capable of simultaneously determining the position and orientation of more than one object 80 and that single object 80 is presented in FIG. 2 for sake of clarity only.

Figure 3:
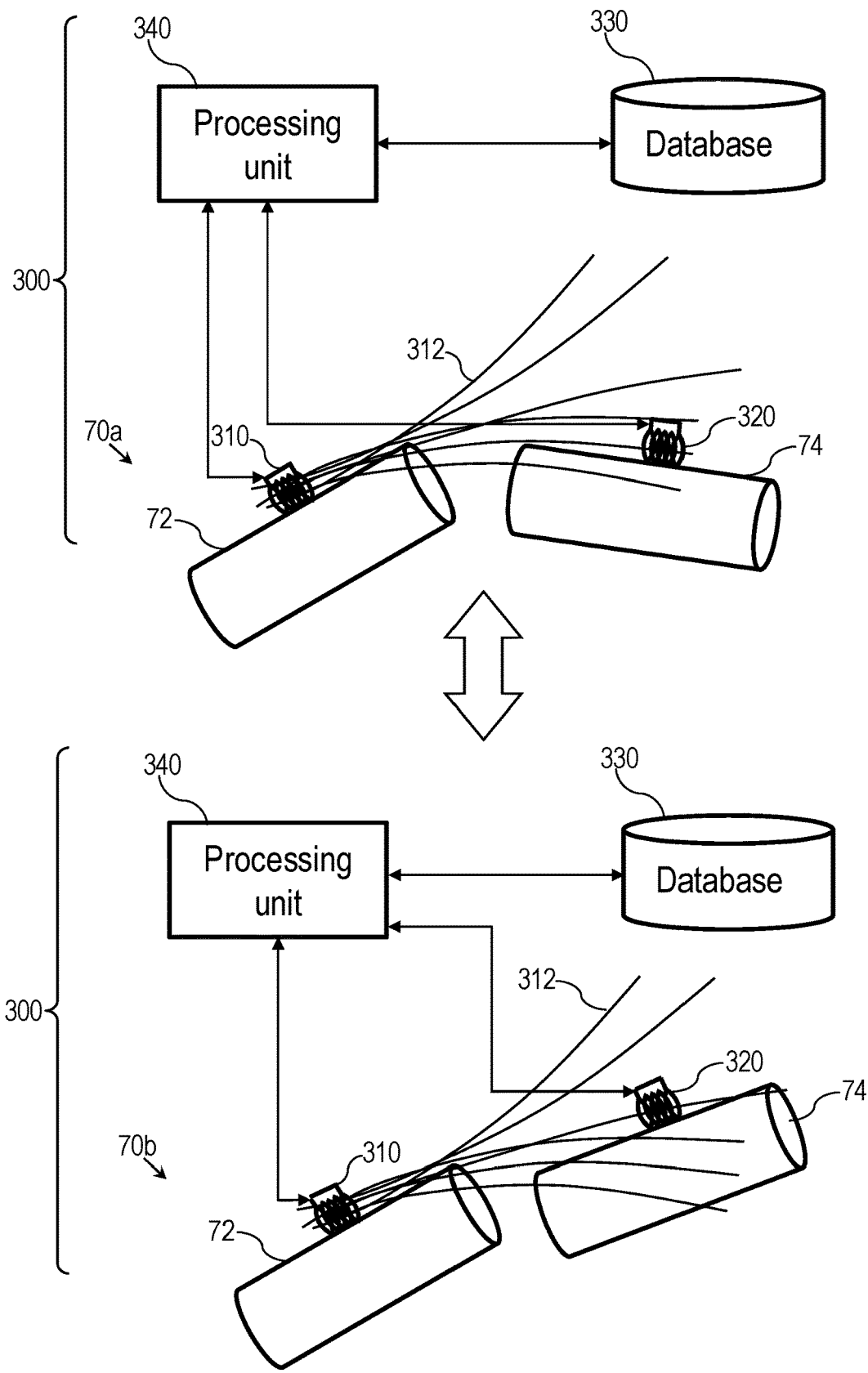
FIG. 3 is a schematic illustration of a system for determining a relative position between two or more elements, according to some embodiments of the invention.

Reference is now made to FIG. 3, which is a schematic illustration of a system 300 for determining a relative position between two or more elements, according to some embodiments of the invention.

According to some embodiments, system 300 may include at least one transmitter 310, at least one receiver 320, a database 330 and a processing unit 340.

Transmitter 310 may be rigidly attachable to a first element 72 and receiver 320 may be rigidly attachable to a second element 74. A relative position and orientation between first element 72 and second element 74 may be changed between at least two different positions and orientations. For example, FIG. 3 shows two different relative positions and orientations 70a, 70b between first element 72 and second element 74. Accordingly, a relative transmitter-receiver position and orientation between transmitter 310 (e.g., rigidly attached to first element 72) and receiver 320 (e.g., rigidly attached to second element 74) may be changed between at least two different transmitter-receiver positions and orientations.

Transmitter 310 may generate a magnetic field. Receiver 320 may measure magnetic field 312 when receiver 320 and transmitter 310 are at a transmitter-receiver position and orientation and generate a receiver output signal. Processing unit 340 may receive the receiver output signal from receiver 320. Processing unit 340 may generate a measured dataset based on the receiver output signal. The measured dataset may include a measured dataset value that may represent the total magnetic field measured by receiver 320 at the transmitter-receiver position and orientation with respect to transmitter 310.

According to some embodiments, database 330 may include at least two reference receiver-transmitter position and orientation datasets. Each of the at least two reference receiver-transmitter position and orientation datasets may include at least one reference receiver-transmitter position and orientation dataset value that may represent the magnetic field measured by receiver 320 for one of the at least two different transmitter-receiver positions and orientations of receiver 320 with respect to transmitter 310.

According to some embodiments, processing unit 340 may compare the measured dataset with at least one of the at least two reference receiver-transmitter position and orientation datasets (e.g., in a similar manner as described above with respect to FIG. 1H). Processing unit 340 may identify, based on the comparison thereof, a reference receiver-transmitter position and orientation dataset of the at least two reference receiver-transmitter position and orientation datasets that corresponds to the measured dataset.

In some embodiments, processing unit 340 may determine, based on the identified reference receiver-transmitter position and orientation dataset, the relative position and orientation between first element 72 and second element 74.

In some embodiments, for example when none of the at least two reference receiver-transmitter position and orientation datasets corresponds to the measured dataset, processing unit 340 may determine an additional reference receiver-transmitter position and orientation dataset based on the measured dataset and an information (e.g., user's input, another tracking system, etc.) concerning a current relative position and orientation between first element 72 and second element 74 (e.g., as described above with respect to FIGS. 1A, 1B, 1C, 1D, 1E and 1F). In some other embodiments, when none of the at least two reference receiver-transmitter position and orientation datasets corresponds to the measured dataset, processing unit 340 may generate a respective notification.

In various embodiments, two or more transmitters 310 and/or two or more receivers 320 may be used (e.g., as described above with respect to FIGS. 1F, 1G, 1H and FIG. 2).

It is noted that system 300 may be capable of determining the relative position and orientation between more than two elements and that FIG. 3 and the respective description present two elements for sake of clarity only.

According to some embodiments, the at least two reference receiver-transmitter position and orientation datasets may be predetermined (e.g., similar to predetermination of the at least two reference configuration datasets as described above with respect to FIGS. 1A, 1B, 1C, 1D, 1E and 1F).

For example, the relative position and orientation between first element 72 and second element 74 may be defined by a set of parameters $p_i$, wherein $1 \leq i \leq n$: $\{p_1, p_2, \ldots, p_n\}$ (e.g., x, y, z coordinates and an orientation angle $\alpha$). Yet in this example, N transmitters T may be rigidly attached to first element 72 and N receivers R may be rigidly attached to second element 74. Yet in this example, a receiver output signal generated by each receiver $R_i$ based on the magnetic field generated by each transmitter $T_j$ may be $S_{R_i}^{T_j}$. The dependence of the receiver signal outputs and the relative position and orientation between first element 72 and second element 74 may be unambiguously predetermined and stored in database 330:

$$\begin{matrix} S_{R_1}^{T_1} & S_{R_1}^{T\ldots} & S_{R_1}^{T_N} \\ S_{R\ldots}^{T_1} & \ldots & S_{R\ldots}^{T_N} \\ S_{R_N}^{T_1} & S_{R_N}^{T\ldots} & S_{R_M}^{T_1} \end{matrix} \leftrightarrow \{p_1, p_2, \ldots, p_n\}$$

Yet in this example, comparison between the receiver output signals (or the measured datasets determined based on them) with the predetermined dependence of the receiver signal outputs and the relative position and orientation between first element 72 and second element 74 may yield the relative position and orientation between first element 72 and second element 74.

Reference is now made to FIG. 4, which is a flowchart of a method 400 of determining a configuration of a measurement volume and of determining a position and orientation of an object within the measurement volume, according to some embodiments of the invention.

Method 400 may be implemented by systems 100 and/or 200 described above with respect to FIGS. 1A, 1B, 1C, 1D, 1E, 1F, 1G, 1H and FIG. 2, respectively, which may be configured to implement method 400. It is noted that method 400 is not limited to the flowcharts illustrated in FIG. 4 and to the corresponding description. For example, in various embodiments, method 400 needs not move through each illustrated box or stage, or in exactly the same order as illustrated and described.

According to some embodiments, method 400 may include generating, by at least one transmitter positioned at corresponding at least one transmitter position within a measurement volume, a transmitted magnetic field within the measurement volume (stage 402). For example, at least one transmitter 110 and/or at least one transmitter 210 and measurement volume 90 as described above with respect to FIGS. 1A-1F and FIG. 2.

In some embodiments, method 400 may include measuring, by at least one receiver positioned at corresponding at least one receiver position within the measurement volume, a total magnetic field in the measurement volume at the at least one receiver position (state 404). For example, at least one receiver 120 and/or at least one receiver 220 and total magnetic field 112 as described above with respect to FIGS. 1A-1F and FIG. 2.

In some embodiments, method 400 may include generating, by the at least one receiver and based on the measured magnetic field, at least one receiver output signal (stage 406). For example, the at least one receiver output signal as described above with respect to FIGS. 1A-1F and FIG. 2.

In some embodiments, method 400 may include generating, by a processing unit and based on the at least one receiver output signal, a measured dataset comprising at least one measured dataset value that represents the total magnetic field measured by the at least one receiver at the at least one receiver position (stage 408). For example, processing unit 140 and/or processing unit 240 and the measured dataset as described above with respect to FIGS. 1A-1F and FIG. 2.

In some embodiments, method 400 may include comparing, by the processing unit, the measured dataset with at least one of at least two reference configuration datasets, wherein each of the at least one of at least two reference configuration datasets comprises at least one reference configuration dataset value that represents the total magnetic field measured in at least one location in the measurement volume for one of at least two different configurations of the measurement volume (stage 410). For example, as described above with respect to FIGS. 1A-1F and FIG. 2.

In some embodiments, method 400 may include identifying, by the processing unit, based on the comparison thereof, a reference configuration dataset of the at least two reference configuration datasets that corresponds to the measured dataset (stage 412). For example, as described above with respect to FIGS. 1A-1F and FIG. 2.

In some embodiments, method 400 may include determining, by the processing unit, the configuration of the measurement volume based on the identified reference configuration dataset (stage 414). For example, as described above with respect to FIGS. 1A-1F and FIG. 2.

In some embodiments, method 400 may include determining, by the processing unit, when none of the at least two reference configuration datasets correspond to the measured dataset, an additional reference configuration dataset based on the measured dataset and an information concerning a current configuration of the measurement volume (stage 416). For example, as described above with respect to FIGS. 1A-1F and FIG. 2.

In some embodiments, method 400 may include generating, by the processing unit, when none of the at least two reference configuration datasets correspond to the measured dataset, a respective notification (stage 418).

According to some embodiments, method 400 may include rigidly attaching the at least one receiver to at least one object positioned within the measurement volume such that when the at least one object changes its position and orientation between, the at least one receiver changes its position and orientation accordingly (stage 420). For example, as described above with respect to FIG. 2.

In some embodiments, method 400 may include comparing, by the processing unit, the measured dataset with at least one of at least two reference receiver-transmitter position and orientation datasets, wherein each of the at least two reference receiver-transmitter position and orientation datasets comprises at least one reference receiver-transmitter position and orientation dataset value that represents the magnetic field measured for one of at least two different transmitter-receiver positions and orientations of the at least one receiver with respect to the at least one transmitter (stage 422). For example, as described above with respect to FIG. 2.

In some embodiments, method 400 may include identifying, by the processing unit, based on the comparison thereof and based on the identified reference configuration dataset, a reference receiver-transmitter position and orientation dataset of the at least two reference receiver-transmitter position and orientation datasets that corresponds to the measured dataset (stage 424). For example, as described above with respect to FIG. 2.

In some embodiments, method 400 may include determining, by the processing unit, based on the identified reference receiver-transmitter position and orientation dataset, the position and orientation of the at least one object within the measurement volume (stage 426). For example, as described above with respect to FIG. 2.

In some embodiments, method 400 may include determining, by the processing unit, when none of the at least two reference receiver-transmitter position and orientation datasets corresponds to the measured dataset, an additional reference receiver-transmitter position and orientation dataset based on the measured dataset and an information concerning a current position and orientation of the at least one object within the measurement volume (stage 428). For example, as described above with respect to FIG. 2.

Reference is now made to FIG. 5, which is a flowchart of a method 500 of determining a relative position between two or more elements, according to some embodiments of the invention.

Method 500 may be implemented by system 300 described above with respect to FIG. 3, respectively, which may be configured to implement method 300. It is noted that method 500 is not limited to the flowcharts illustrated in FIG. 5 and to the corresponding description. For example, in various embodiments, method 500 needs not move through each illustrated box or stage, or in exactly the same order as illustrated and described.

According to some embodiments, method 500 may include generating, by at least one transmitter rigidly attached to a first element, a magnetic field (stage 502). For example, at least one transmitter 310 and first element 72 described above with respect to FIG. 3.

In some embodiments, method 500 may include measuring, by at least one receiver rigidly attached to a second element, the magnetic field when the first element and second element are at a specified position and orientation with respect to each other and when the at least one receiver and the at least one transmitter are at a receiver-transmitter position and orientation with respect to each other (stage 504). For example, at least one receiver 320 as described above with respect to FIG. 3.

In some embodiments, method 500 may include generating, by the at least one receiver, at least one receiver output signal based on the measured magnetic field (stage 506). For example, as described above with respect to FIG. 3.

In some embodiments, method 500 may include generating, by a processing unit, a measured dataset based on the at least one receiver output signal, wherein the measured dataset comprises at least one measured dataset value that represents the magnetic field measured by the at least one receiver at the receiver-transmitter position and orientation with respect to the at least one transmitter (stage 508). For example, processing unit 340 and the measured dataset as described above with respect to FIG. 3.

In some embodiments, method 500 may include comparing, by the processing unit, the measured dataset with at least one of at least two reference receiver-transmitter position and orientation datasets, wherein each of the at least two reference receiver-transmitter position and orientation datasets comprises at least one reference receiver-transmitter position and orientation dataset value that represents the magnetic field measured for one of at least two different transmitter-receiver positions and orientations of the at least one receiver with respect to the at least one transmitter (stage 510). For example, as described above with respect to FIG. 3.

In some embodiments, method 500 may include identifying, by the processing unit, based on the comparison thereof, a reference receiver-transmitter position and orientation dataset of the at least two reference receiver-transmitter position and orientation datasets that corresponds to the measured dataset (stage 512). For example, as described above with respect to FIG. 3.

In some embodiments, method 500 may include determining, by the processing unit, based on the identified reference receiver-transmitter position and orientation dataset, the relative position and orientation between the first element and the second element (stage 514). For example, as described above with respect to FIG. 3.

In some embodiments, method 500 may include determining, by the processing unit, when none of the at least two reference receiver-transmitter position and orientation datasets corresponds to the measured dataset, an additional reference receiver-transmitter position and orientation dataset based on the measured dataset and an information concerning a current relative position and orientation between the first element and the second element (stage 516). For example, as described above with respect to FIG. 3.

Some aspects of the present invention may provide a system and method for determining a configuration of a measurement volume. Some other aspects of the present invention may further provide systems and methods for determining a position and orientation of an object within the measurement volume. Some other aspects of the present invention may further provide systems and methods for determining a relative position and orientation of two elements.

The determination of the configuration of the measurement volume by the disclosed systems and methods may be based on a magnetic field measured within the measurement volume by one or more receivers located therein and based on reference configuration datasets, while eliminating a need in connecting/attaching sensors to elements or objects within the measurement volume (e.g., as described above with respect to FIGS. 1A-1H).

The disclosed systems and methods are not limited to specific locations of transmitters and receivers within the measurement volume. This in contrast to, for example, other available systems that typically utilize optical means (and thus require direct line of sight to the elements/objects in the measurement volume) or inertial means (and thus suffer from drifting) for determining the configuration of the measurement volume.

As the disclosed systems and methods do not require direct contact or line of sight to the elements or objects within the measurement volume, the systems and methods may be capable of determining configurations that cannot be observable by an external user. For example, disconnection within an electrical circuit in one of the elements of the measurement volume may, for example, affect the magnetic field within the measurement volume and thus may be detected by the system.

Furthermore, such configurations that cannot be observable by an external user may be detectable even if there are no specific reference configuration datasets for the configurations thereof. For example, the system may detect that there is no reference configuration dataset for a particular configuration of the measurement volume and generate a respective notification. Such notification may be indicative of, for example, a failure in one or more elements of the measurement volume. In this manner, the disclosed systems and methods may be capable of improving safety and enhancing monitoring of the measurement volume and the elements thereof.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions can also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram portion or portions thereof. The computer program instructions can also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram portion or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams can represent a module, segment, or portion of code, which includes one or more executable instructions for implementing the specified logical function(s). It should also be noted that, in some alternative implementations, the functions noted in the portion can occur out of the order noted in the figures. For example, two portions shown in succession can, in fact, be executed substantially concurrently, or the portions can sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention can be described in the context of a single embodiment, the features can also be provided separately or in any suitable combination. Conversely, although the invention can be described herein in the context of separate embodiments for clarity, the invention can also be implemented in a single embodiment. Certain embodiments of the invention can include features from different embodiments disclosed above, and certain embodiments can incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A system for determining a configuration of a measurement volume, the system comprising:
   at least one transmitter adapted to be positioned within the measurement volume at corresponding at least one transmitter position and adapted to generate a transmitted magnetic field within the measurement volume;
   at least one receiver adapted to be positioned within the measurement volume at corresponding at least one receiver position, the at least one receiver is adapted to measure a total magnetic field in the measurement volume at the at least one receiver position and generate at least one receiver output signal;
   a database comprising at least two reference configuration datasets each comprising at least one reference configuration dataset value that represents a total magnetic field premeasured in at least one location in the measurement volume for one of at least two different configurations of the measurement volume; and
   a processing unit configured to:
      receive the at least one receiver output signal,
      generate a measured dataset based on the at least one receiver output signal, the measured dataset comprises at least one measured dataset value that represents the total magnetic field measured by the at least one receiver at the at least one receiver position,
      compare the measured dataset with at least one of the at least two reference configuration datasets, and
      identify, based on the comparison thereof, a reference configuration dataset of the at least two reference configuration datasets that corresponds to the measured dataset.

2. The system of claim 1, wherein the processing unit is further configured to determine the configuration of the measurement volume based on the identified reference configuration dataset.

3. The system of any one of claim 1, wherein the processing unit is configured, when none of the at least two reference configuration datasets correspond to the measured dataset, to determine an additional reference configuration dataset based on the measured dataset and an information concerning a current configuration of the measurement volume or to generate a respective notification.

4. The system of claim 1,
   wherein the measurement volume comprises at least one object that can change its position and orientation between at least two different object positions and/or orientations, and
   wherein the at least one receiver is rigidly attachable to the at least one object such that when the at least one object changes its position and orientation between, the at least one receiver changes its position and orientation accordingly.

5. The system of claim 4, wherein:
   the database comprises at least two reference receiver-transmitter position and orientation datasets, and wherein
   each of the at least two reference receiver-transmitter position and orientation datasets comprises at least one reference receiver-transmitter position and orientation dataset value that represents the total magnetic field measured for one of at least two different transmitter-receiver positions and orientations of the at least one receiver with respect to the at least one transmitter.

6. The system of claim 5, wherein the processing unit is configured to:
   compare the measured dataset with at least one of the at least two reference receiver-transmitter position and orientation datasets; and
   identify, based on the comparison thereof and based on the identified reference configuration dataset, a reference receiver-transmitter position and orientation dataset of the at least two reference receiver-transmitter position and orientation datasets that corresponds to the measured dataset.

7. The system of claim 6, wherein the processing unit is configured to determine, based on the identified reference receiver-transmitter position and orientation dataset, the position and orientation of the at least one object within the measurement volume.

8. The system of claim 6, wherein the processing unit is configured, when none of the at least two reference receiver-transmitter position and orientation datasets corresponds to the measured dataset, to determine an additional reference receiver-transmitter position and orientation dataset based on the measured dataset and an information concerning a current position and orientation of the at least one object within the measurement volume or to generate a respective notification.

9. A method of determining a configuration of a measurement volume, the method comprising:
   generating, by at least one transmitter positioned at corresponding at least one transmitter position within a measurement volume, a transmitted magnetic field within the measurement volume;
   measuring, by at least one receiver positioned at corresponding at least one receiver position within the measurement volume, a total magnetic field in the measurement volume at the at least one receiver position and generating at least one receiver output signal;
   generating, by a processing unit and based on the at least one receiver output signal, a measured dataset comprising at least one measured dataset value that represents the total magnetic field measured by the at least one receiver at the at least one receiver position;
   comparing, by the processing unit, the measured dataset with at least one of at least two reference configuration datasets, wherein each of the at least one of at least two reference configuration datasets comprises at least one reference configuration dataset value that represents the total magnetic field measured in at least one location in the measurement volume for one of at least two different configurations of the measurement volume; and
   identifying, by the processing unit, based on the comparison thereof, a reference configuration dataset of the at least two reference configuration datasets that corresponds to the measured dataset.

10. The method of claim 9, further comprising determining, by the processing unit, the configuration of the measurement volume based on the identified reference configuration dataset.

11. The method of claim 9, further comprising determining, by the processing unit, when none of the at least two reference configuration datasets correspond to the measured dataset, an additional reference configuration dataset based on the measured dataset and an information concerning a current configuration of the measurement volume or generating a respective notification.

12. The method of claim 9, further comprising rigidly attaching the at least one receiver to at least one object positioned within the measurement volume such that when the at least one object changes its position and orientation between, the at least one receiver changes its position and orientation accordingly.

13. The method of claim 12, further comprising comparing, by the processing unit, the measured dataset with at least one of at least two reference receiver-transmitter position and orientation datasets, wherein each of the at least two reference receiver-transmitter position and orientation datasets comprises at least one reference receiver-transmitter position and orientation dataset value that represents the magnetic field measured for one of at least two different transmitter-receiver positions and orientations of the at least one receiver with respect to the at least one transmitter.

14. The method of claim 13, further comprising identifying, by the processing unit, based on the comparison thereof and based on the identified reference configuration dataset, a reference receiver-transmitter position and orientation dataset of the at least two reference receiver-transmitter position and orientation datasets that corresponds to the measured dataset.

15. The method of claim 14, further comprising determining, by the processing unit, based on the identified reference receiver-transmitter position and orientation dataset, the position and orientation of the at least one object within the measurement volume.

16. The method of claim 14, further comprising determining, by the processing unit, when none of the at least two reference receiver-transmitter position and orientation datasets corresponds to the measured dataset, an additional reference receiver-transmitter position and orientation dataset based on the measured dataset and an information concerning a current position and orientation of the at least one object within the measurement volume or generating a respective notification.

* * * * *